United States Patent
Ayres et al.

(10) Patent No.: US 7,882,410 B2
(45) Date of Patent: Feb. 1, 2011

(54) LAUNCH-ON-SHIFT SUPPORT FOR ON-CHIP-CLOCKING

(75) Inventors: Timothy N. Ayres, Milpitas, CA (US); Peter Wohl, Williston, VT (US); John A. Waicukauski, Tualatin, OR (US)

(73) Assignee: Synopsys, Inc., Mountain View, CA (US)

( * ) Notice: Subject to any disclaimer, the term of this patent is extended or adjusted under 35 U.S.C. 154(b) by 730 days.

(21) Appl. No.: 11/767,606

(22) Filed: Jun. 25, 2007

(65) Prior Publication Data

US 2008/0320348 A1    Dec. 25, 2008

(51) Int. Cl.
*G01R 31/3177* (2006.01)
*G01R 31/40* (2006.01)
(52) U.S. Cl. .................... 714/731; 714/729
(58) Field of Classification Search .......... None
See application file for complete search history.

(56) References Cited

U.S. PATENT DOCUMENTS

| 2004/0163021 A1* | 8/2004 | Nadeau-Dostie | 714/726 |
| 2006/0136795 A1* | 6/2006 | Gunda et al. | 714/726 |
| 2006/0282735 A1* | 12/2006 | Weinraub et al. | 714/742 |
| 2008/0091996 A1* | 4/2008 | Chung | 714/727 |

* cited by examiner

*Primary Examiner*—Jeffrey A Gaffin
*Assistant Examiner*—Dipakkumar Gandhi
(74) *Attorney, Agent, or Firm*—Silicon Valley Patent Group, LLP; Edward S. Mao (57) ABSTRACT

A method to perform launch-on-shift scanning for integrated circuits having multiple clock domains is presented. An integrated circuit includes both capture clock domains and non-capture clock domains. The portions of the test vectors for non-capture clock domains are shifted into the scan chains of the non-capture clock domains and allowed to settle prior to the last shift launch cycle and the capture cycle of the capture clock domains. Thus, the ambiguity of the timing between the non-capture domains and the capture domains caused by asynchronous clock signals is eliminated.

22 Claims, 5 Drawing Sheets

LAUNCH-ON-SHIFT SUPPORT FOR ON-CHIP-CLOCKING

BACKGROUND

1. Field of the Invention

The invention relates to testing of integrated circuits. More specifically, the invention relates to a method and an apparatus for testing integrated circuits having multiple clock domains.

2. Related Art

As the complexity of integrated circuits has increased, chip designers have increasingly become dependent on EDA tools (electronic design automation). Furthermore, EDA tools have allowed addition of more features for testing the integrated circuits. In addition to testing the design of the integrated circuits, most EDA tools also support design for testability (DFT), which allows testing of a manufactured integrated circuit.

The most common design for testability feature is the inclusion of one or more scan chains in an integrated circuit. Scan chains are formed by tying scan elements, such as internal registers, flip-flops, and other storage elements, in series. The scan chains are then tied to external chip pins via bonding pads. The elements in the scan chain have two functional modes. In the "normal mode", the elements in the scan chain perform the intended logic functions of the integrated circuit. In the "scan mode", the elements of the scan chain are configured to serially receive data or to serially output the current state of the elements in the scan chain. For example, test vectors can be scanned into the scan chain, then the integrated circuit is allowed to function as intended for one or more clock cycles. Then the data from the scanned chain is read to determine whether the integrated circuit performed correctly. The, two main type of scan chain testing are DC scans and AC scans. Furthermore, additional storage elements can be added to the scan chain to allow control bits to be stored in the integrated circuit during testing.

For DC scans, the test vectors are scanned into the integrated circuit at a slow scanning frequency. Then the chip is operated at a testing frequency (often the same as the scanning frequency) that is typically much lower than the actual operating frequency of the integrated circuit. Thus, DC Scans are well suited for finding "stuck bits" and other low frequency issues. However, DC Scans are not suited for finding race conditions, delay issues, and other problems that only occur at high frequencies. AC scans are designed to catches these high frequency issues.

In AC scanning the test vector is loaded at the scanning frequency, then testing occurs at or near the operating frequency. While, AC scanning can be done using clock signals from the test equipment coupled to the integrated circuit, more accurate results are obtained by using clock signals generated by a phase locked loop within the integrated circuit. The two most common AC scan methods are Launch-on-Capture and Launch-on-shift. In launch-on-capture, the entire test vector is loaded into the integrated circuit at the scanning frequency. Then, the integrated circuit is clocked twice by a PLL clock signal (i.e. a clock signal from a Phase Locked Loop within the integrated circuit) at the operating frequency in normal mode. The first pulse allows the entered test vector to be converted into a second test vector based on the logic functions of the integrated circuit. The second pulse generates the test results of the second test vector.

Figure 1A:
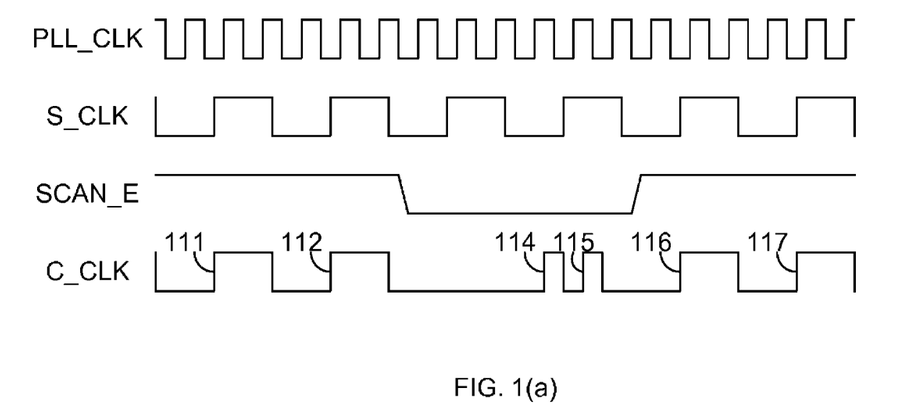
FIGS. 1(a)-1(b) are a simplified timing diagrams for conventional AC scanning.

FIG. 1(a) illustrates the timing diagram of launch-on-capture scan run. For illustrative purposes, PLL clock signal PLL_CLK is only shown to have roughly three times the frequency of a scan clock signal S_CLK, which is generally provided by for test equipment coupled to the integrated circuit, however on actual test equipment and integrated circuit PLL clock signal PLL_CLK may have a frequency that is several orders of magnitude greater than the frequency of scan clock signal S_CLK. Circuit clock signal C_CLK shows the clock signal that is applied to the scan chain. Thus, in scan mode circuit clock signal C_CLK is based on scan clock signal S_CLK. However, during the actual at speed test when the second test vector and the output data is captured capture cycle clock signal C_CLK is based on PLL clock signal PLL_CLK. A scan enable signal SCAN_E determines whether the scan chain is in "scan mode" or "normal mode". In FIG. 1(a), when scan enable signal SCAN_E is at logic high, the scan chain is in scan mode. When scan enable signal SCAN_E is at logic low the integrated circuit is in normal mode. As shown in FIG. 1(a), scan enable signal SCAN_E begins at logic high, thus at active clock edges 111 and 112 circuit clock signal C_CLK, new data is serially scanned into the scan chain. For consistency, rising clock edges are used as the active clock edge herein, however in many circuits falling clock edges are used as the active clock edges. Some circuits may even use both rising and falling edges as active edges. Active clock edge 112 clocks the last bit of the test vector into the scan chain. Thus, after active clock edge 112, scan enable signal SCAN_E transitions to logic low and the scan chain is in normal mode. After the transition of scan enable signal SCAN_E to logic low, circuit clock signal C_CLK may be held at logic low for a few clock cycles of PLL clock signal PLL_CLK. Then, at active clock edge 114, which is based on PLL clock signal PLL_CLK, the normal logic functions of the scan chain is performed to generate the second test vector. Then, at active clock edge 115, which is also based PLL clock signal PLL_CLK, the scan chain generates the test results from the second test vector. After active clock edge 115, scan enable signal SCAN_E transitions to logic high and the scan chain is in scan mode. Thus, at active clock edges 116 and 117 of circuit clock signal C_CLK, the output data is read out serially from the scan chain (while a new test vector is scanned in).

The clock cycle beginning with active edge 112 is often called the "last scan-in shift cycle" because the last data bit for the scan vector is scanned into the scan chain. The clock cycle beginning with active clock edge 114 is often called the launch cycle because it "launches the test". The clock cycle beginning with active clock edge 115 is often called the "capture cycle" because the test results are captured in the scan chain. Depending on the specific implementation and timing, one or more dummy cycles could be inserted between the last scan-in cycle and the launch cycle. During dummy cycles circuit clock signal C_CLK is usually held at an inactive logic state. (i.e. logic low when rising edges are active edges). Furthermore, dummy cycles could also be inserted after the capture cycle and prior to reading the data from the scan chain.

Figure 1B:
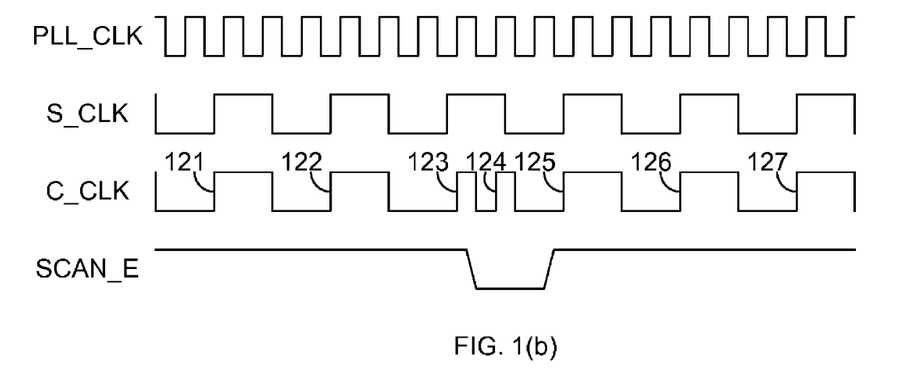

In launch-on-shift scanning, the test vector except for the last bit is scanned into a scan chain of the integrated circuit at the scanning frequency. However, the last bit of the test vector is scanned at the operating frequency and the circuits of the scan chain are operated for a second active clock edge at the operating frequency to generate the test results of the test vector. FIG. 1(b) illustrates the timing for launch-on-shift scanning. As in FIG. 1(a), for illustrative purposes the, a PLL clock signal PLL_CLK is only shown to have roughly three times the frequency of a scan clock signal S_CLK. Circuit clock signal C_CLK shows the clock signal that is applied to the scan chain. Scan enable signal SCAN_E determines whether the scan chain is in "scan mode" or "normal mode". As shown in FIG. 1(b), scan enable signal SCAN_E begins at logic high, thus at active clock edges 121, and 122 of circuit clock signal C_CLK, the new data is serially into the scan chain. Unlike in launch-on-capture scans, for launch-on-shift scanning, the last bit of the test vector is scanned at the frequency of PLL clock signal PLL_CLK. Thus, active edge 123, which is followed by active clock edge 124 of circuit clock signal C_CLK is based on PLL clock signal P_CLK. Active clock edge 123 clocks the last bit of the test vector into the scan chain. Scan enable signal SCAN_E must transition to logic low after active clock edge 123 and before active clock edge 124. At rising clock edge 124, which is based on PLL clock signal PLL_CLK, the normal logic functions of the scan chain is performed to generate the test results. After rising clock edge 124, scan enable signal SCAN_E transitions to logic high, which places the scan chain into scan mode. Thus, at active clock edges 125, 126, and 127 of circuit clock signal C_CLK, the output data is read out serially from the scan chain (while a new test vector is scanned in).

For launch-on-shift scanning, the "launch cycle" and the "last scan-in shift cycle" are the same and begin with active clock edge 123. For clarity, the term "last shift launch cycle" is used herein to refer to the cycle that shifts the last data bit into the scan chain and launches the testing of the integrated circuit. The clock cycle beginning with active clock edge 124 is often called the capture cycle. Depending on the specific implementation and timing, one or more dummy cycles could be inserted before the last shift launch cycle. During dummy cycles circuit clock signal C_CLK is usually held at an inactive logic state. (i.e. logic low when rising edges are active edges). Furthermore, dummy cycles could also be inserted after the capture cycle and prior to reading the data from the scan chain.

As processing technology improved, the number of transistors on a single integrated circuits has increased drastically. To make use of the large number of available transistors, designers now use hierarchical design methodologies. Generally, a complex design is broken down into various layers of logic blocks. The logic blocks can be designed independently and can even be shared between different designs. The logic blocks are converted into physical blocks that are positioned in a floor plan for the integrated circuit. Furthermore, the circuits of an integrated circuit are generally divided between a number of clock domains. Clock domains could be used for circuits operating at different frequencies. Other reasons to use multiple clock domains are to lessen loads on clock lines and to reduce the length of clock lines to control propagation delay. Generally, each clock domain includes a phase locked loop to generate the clock signal for the clock domain. Thus, each clock domain in general is asynchronous as compared to other clock domains. However, circuits in different clock domains do interact. Thus, when performing launch-on-shift scanning, the timing uncertainty between circuits in different clock domains makes the circuit state during the capture cycle unpredictable. Hence there is a need or a method and apparatus for forming performing launch-on-shift scanning on integrated circuits having multiple clock domains.

SUMMARY

Accordingly, the present invention provides a method to perform launch-on-shift scanning for integrated circuits having multiple clock domains. For example, in some embodiments of the present invention, the clock domains are divided into capture clock domains and non-capture clock domains. The portions of the test vectors for non-capture clock domains are shifted into the scan chains of the non-capture clock domains and allowed to settle prior to the last shift launch cycle and the capture cycle of the capture clock domains. Thus, the ambiguity of the timing between the non-capture domains and the capture domains caused by asynchronous clock signals is eliminated.

Specifically, in one embodiment of the presenting invention, an integrated circuit includes a first capture clock domain with a first capture clock domain scan chain and a first non capture clock domain with a first non-capture clock domain scan chain. A beginning subset of a first portion of a test vector is shifted into the first capture clock domain scan chain and a beginning subset of a second portion of the test vector is shifted into the first non-capture clock domain scan chain. The shifting of the beginning subset of the first portion of the test vector and the shifting of the beginning subset of the second portion of the test vector can occur simultaneously and in general is based on a first clock signal from an external test equipment. Then, an ending subset of the second portion of the test vector is shifted into the first non-capture clock domain scan chain followed by shifting an ending subset of the first portion of the test vector into the first capture clock domain scan chain. Generally, the shifting of the ending subset of the second portion of the test vector is also based on the first clock signal; however, the shifting of the ending subset of the first portion of the test vector is based on a second clock signal that is generated within the integrated circuit. Then, the first capture clock domain is clocked (again based on the second clock signal) to generate test results in the first capture clock domain scan chain.

The present invention will be more fully understood in view of the following description and drawings.

DETAILED DESCRIPTION

Figure 2:
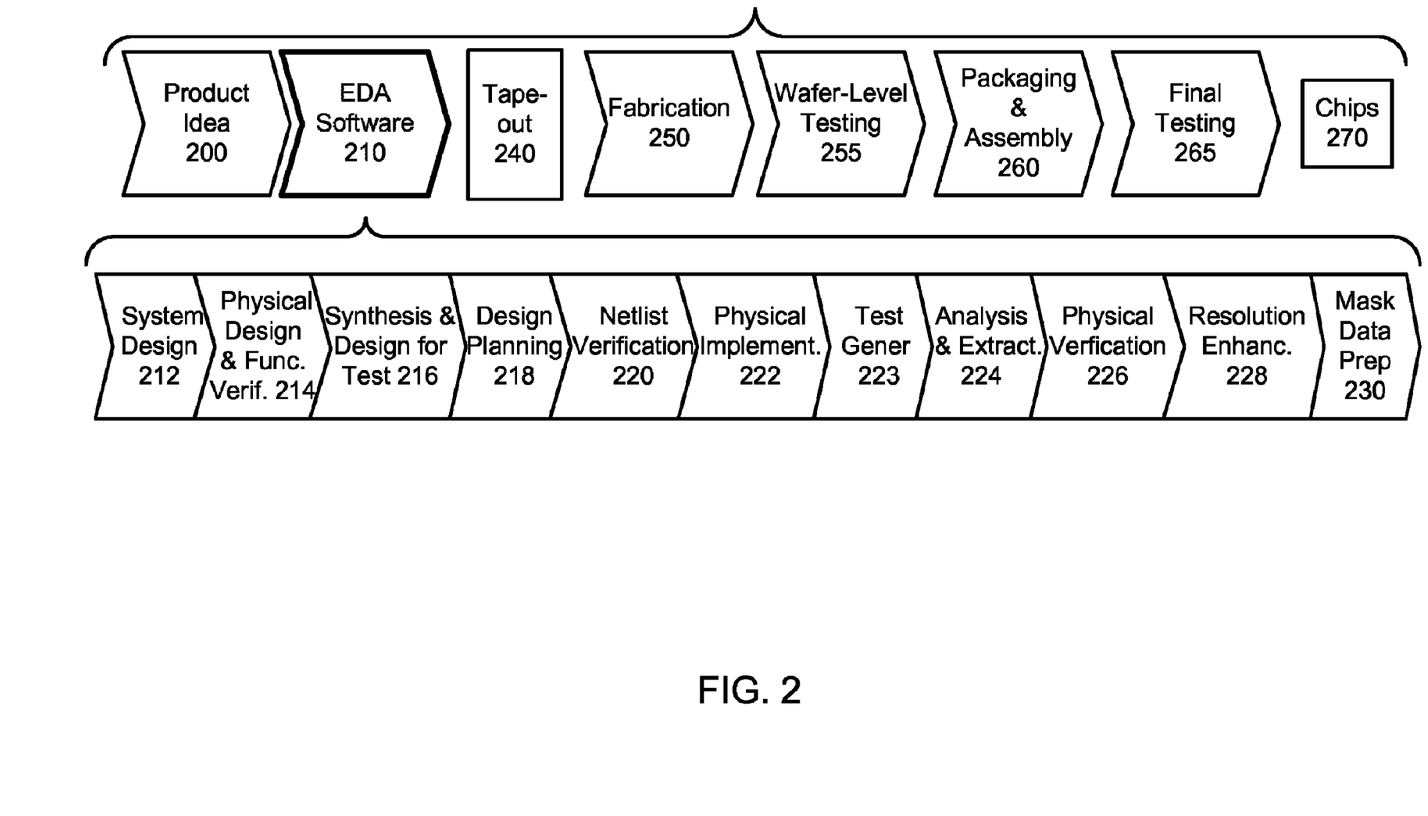
FIG. 2 is a simplified representation of an exemplary digital IC design flow in accordance with one embodiment of the present invention.

It may be helpful to place the processes of this invention in context of the overall chip design. FIG. 2 shows a simplified representation of an exemplary digital IC design flow. At a high level, the process starts with the product idea (200) and is realized in a EDA software design process (210). When the design is finalized, it can be taped-out (event 240). After tape out, the fabrication process (250) creates wafers containing the IC. Wafer level testing (255) can be performed to detect and remove defective wafers (or dies). Then the non-defective dies are packaged and assembled in a packaging and assembly processes (260). Final testing (265) of the packaged IC is a final quality control process to remove any defective products. Packaged ICs that pass the final test result in the finished chips (270) that are delivered to consumers of the IC. The principles of the present invention can be used during wafer-level testing as well as during final testing.

The EDA software design process (210) is actually composed of a number of stages 212-230, shown in linear fashion for simplicity. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC. A brief description of the components of the EDA software design process (stage 210) will now be provided.

System design (stage 212): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 214): At this stage, the VHDL or Verilog code for modules in the system is written and the design (which may be of mixed clock domains) is checked for functional accuracy. More specifically, the design is checked to ensure the design produces the correct outputs. Exemplary EDA software products from Synopsys, Inc. that can be used at this stage include VCS, VERA, DesignWare®, Magellan, Formality, ESP and LEDA products.

Synthesis and design for test (stage 216): Here, the VHDL/Verilog is translated to a netlist. The netlist can be optimized for the target technology. Additionally, the design and implementation of tests to permit checking of the finished chip occurs. Thus the circuitry used in the present invention are designed in this stage. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 218): Here, an overall floorplan for the chip is constructed and analyzed for timing and top-level routing. Exemplary EDA software products from Synopsys, Inc. that can be used at this stage include Jupiter and Flooplan Compiler products. Although circuitry and portions thereof (such as standard cells) are described herein as if they exist in the real world, it is to be understood that at this stage only a computer model exists in a programmed computer. The actual circuitry in the real world is created after this stage.

Netlist verification (stage 220): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 222): The placement (positioning of circuit elements) and routing (connection of the same) occurs at this step. Exemplary EDA software products from Synopsys, Inc. that can be used at this stage include the Astro product.

Test Generation (stage 223): Automatic Test Pattern Generation is performed on the design and the test patterns are formatted for automatic test equipment. Exemplary EDA software products from Synopsys Inc. that can be used at this stage include the TetraMAX product.

Analysis and extraction (stage 224): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 226): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 228): This stage involves geometric manipulations of the layout to improve manufacturability of the design. Exemplary EDA software products from Synopsys, Inc. that can be used at this include iN-Phase, Proteus, and AFGen products.

Mask data preparation (stage 230): This stage provides the "tape-out" data for production of masks for lithographic use to produce finished chips. Exemplary EDA software products from Synopsys, Inc. that can be used at this stage include the CATS(R) family of products.

Figure 3:
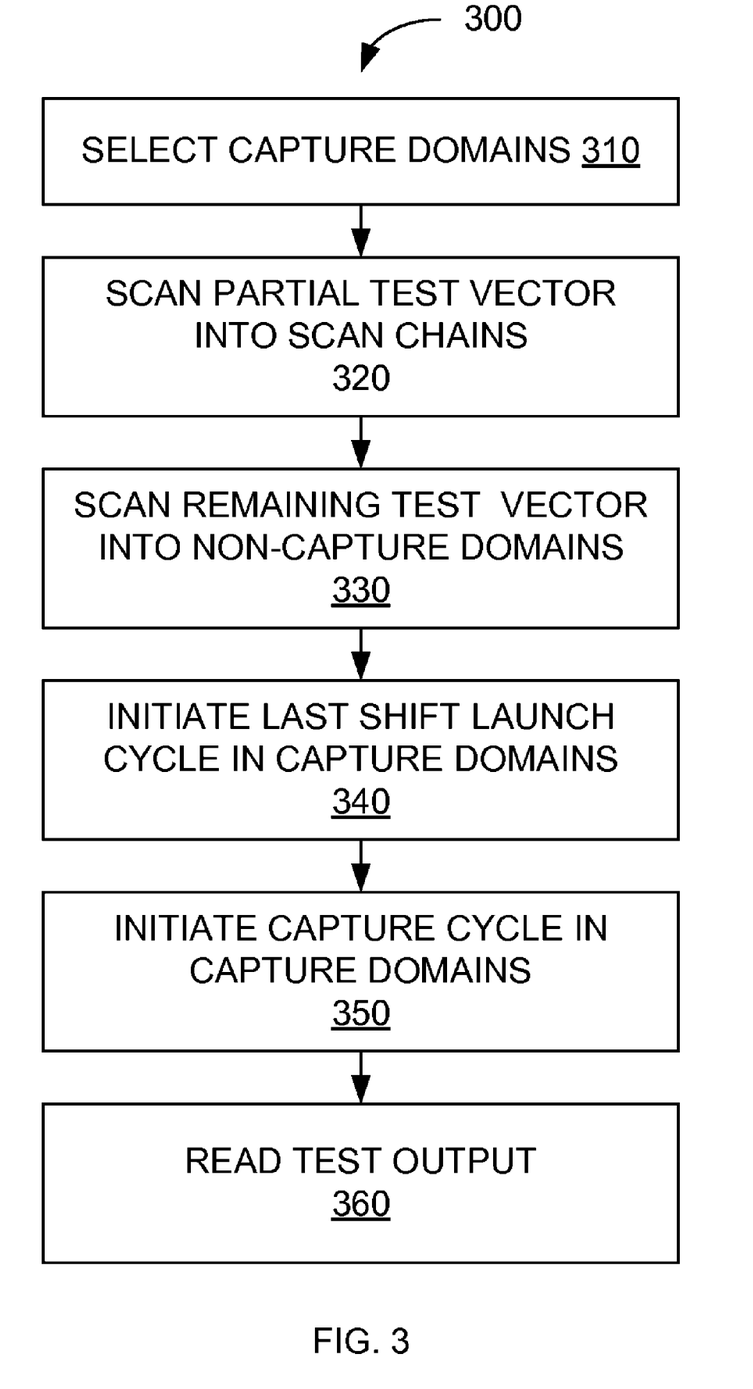
FIG. 3 is a flow chart of one embodiment of the present invention.

FIG. 3 is a flow chart 300 illustrating an embodiment of the present invention for performing launch-on-shift scanning for an integrated circuit with multiple clock domains. Generally, each clock domain has at least one scan chain. Each scan chain that is being used in a test receives a portion of the test vector. The capture clock domains are selected in SELECT CAPTURE CLOCK DOMAINS 310. Conversely clock domains that are not capture clock domains are non-capture clock domains. As well be explained in more details below, certain criteria must be met to have more than one capture clock domain. In SCAN PARTIAL TEST VECTOR INTO SCAN CHAINS 320, the portion of the test vector except for the final bit in each portion is scanned into the corresponding scan chain. Then the last bit of the portions of the test vector in non-capture clock domains are scanned into the corresponding scan chains in SCAN REMAINING TEST VECTOR INTO NON-CAPTURE CLOCK DOMAINS 330. Afterwards, a last shift launch cycle is initiated in the capture clock domains in INITIATE LAST SHIFT LAUNCH CYCLE IN CAPTURE CLOCK DOMAINS 340 followed by a capture cycle in the capture clock domains in INITIATE CAPTURE CYCLE IN CAPTURE CLOCK DOMAINS 350. At this point the test results are in the scan chains and can be read out of the scan chains in READ TEST OUTPUT 360. If other test vectors are to be used than the new test vector can be scanned in as the test results are scanned in.

More generally, embodiments of the present invention are used to test integrated circuits having a first capture clock domain and a first non-capture clock domains. The first capture clock domain has a first capture clock domain scan chain and the first non-capture clock domains has a first non-capture clock domain scan chain. The integrated circuit can have additional capture clock domains and non-capture clock domains. A capture/non-capture control bit is stored within the scan chains (as explained below) to designate whether a particular domain is a capture clock domain or a non-capture clock domain. The test vector includes a first portion with data for the first capture clock domain scan chain and a second portion with data for the first non-capture clock domain scan chain. The first portion of the test data includes a beginning subset and an ending subset. The union of the beginning subset of the first portion and the ending subset of the first portion is equal to the first portion. For example, for one embodiment of the present invention the first portion of the test vector consists of N bits, the beginning subset consists of N−1 bit, and the ending subset consists of 1 bit. Similarly, the second portion of the test vector is also divided into a beginning subset and an ending subset. Testing of the integrated circuit includes shifting the beginning subset of the first portion of the test vector into the first capture clock domain scan chain and shifting the beginning subset of the second portion of the test vector into the first non-capture clock domain scan chain, which can occur simultaneously. Then testing continues with shifting ending subset of the second portion of the test vector into the non-capture clock domain scan chain followed by shifting the ending subset of the first portion of the test vector into the first capture clock domain. Then the first capture clock domain is clocked to generate test results in the first capture clock domain scan chain.

Generally, shifting of the beginning subset of the first portion of the test vector, the beginning subset of the second portion of the test vector, and the ending subset of the second portion of the test vector is based on a first clock signal, that is provided from an external tester. Shifting of the ending subset of the second subset of the test vector and the clocking of the first capture clock domain is based on a second clock signal, that is generated with a phase locked loop within the integrated circuit. The first clock signal and the second signal can be asynchronous. In the embodiment of the present invention described below and illustrated by FIG. 5, the ending subset of the first portion of the test vector includes a single bit and the ending subset of the second portion of the test vector includes a single bit.

By scanning the ending subset of the portions of the test vector into the scan chains in the non-capture clock domain prior to the last shifting of the ending subset of portions of the test vector in the capture clock domains, the present invention avoids the problems caused by having asynchronous clock signals in the different clock domains. Specifically, the data in the non-capture clock domains are allowed to settle prior to the last shift launch cycle and capture cycle in the capture clock domains. Thus, any ambiguity as to the order of the clock edges between the capture clock domains and the non-capture clock domains is eliminated.

As stated above, certain conditions limit whether multiple capture clock domains may be used simultaneously. Generally, clock domains that are independent can be capture clock domains simultaneously. As used herein, a first clock domain is independent of a second clock domain when the order of order of the occurrence of corresponding clock edges between the clock domains does not change the data of each clock domain. However, some embodiments of the invention allow partially independent clock domains to be used as capture clock domains simultaneously. Partially independent clock domains have a subset of independent data that is independent of the clocking order between the clock domains and a subset of dependent data that is dependent on the clocking order between the clock domains. When partially independent clock domains are used as captured domains simultaneously, the subset of data that is dependent is ignored. Independence of clock domains can be determined by using disturb analysis (typically as part of the design rule check (DRC)). The present invention allows disturb analysis to be used because the ambiguity as to the order of the clock edges between the capture clock domains and the non-capture clock domains is eliminated (as explained above). Thus disturb analysis is performed only between the capture domains to determine the subset of dependent data.

In some embodiments of the present invention, clock domains may be synchronized, i.e. the clock signals in synchronized clock domains have a fixed phase difference. The synchronization may be inherent in the integrated circuit or induced during testing of the integrated circuit. Because synchronized clock domains have a fixed clock relationship they can be used as capture clock domains simultaneously.

By allowing multiple clock domains the present invention allows reduction of the number of test vectors used for testing the integrated circuits. Furthermore, testing of multiple capture clock domains simultaneously may allow certain kinds of errors to be detected that might not be detected if only one capture clock domain is used.

Figure 4:
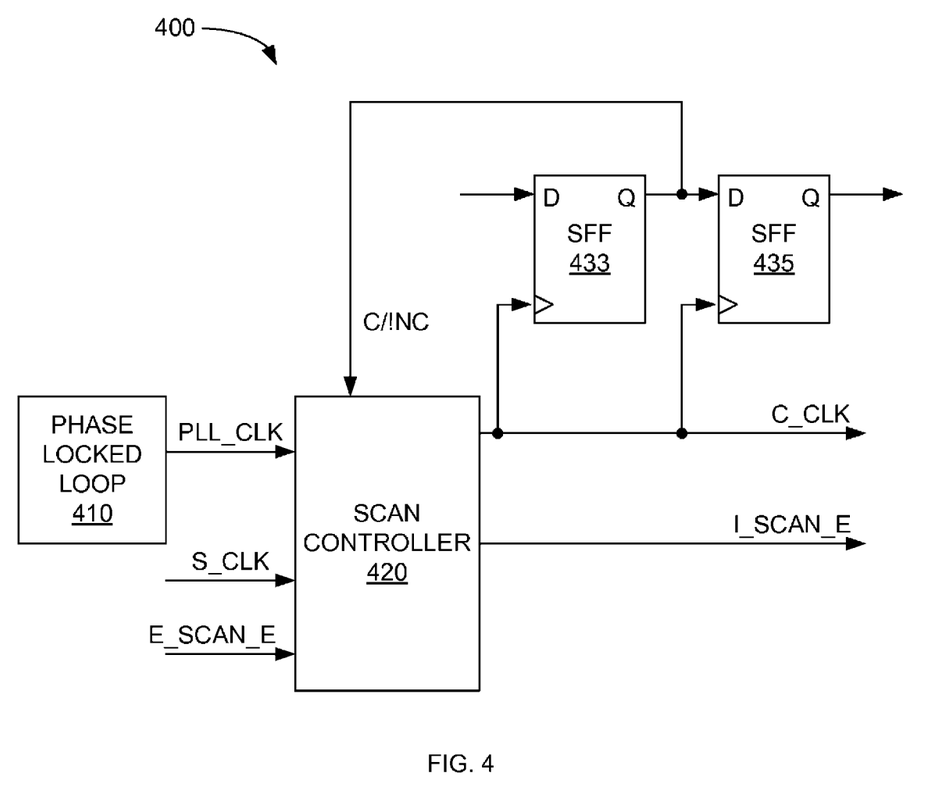
FIG. 4 illustrates a simplified block diagram of a clocking circuit in accordance with one embodiment of the present invention.

FIG. 4 is a block diagram of a clocking circuit 400. Each clock domain would have a version of clocking circuit 400. Clocking circuit 400, includes a phase locked loop 410, a scan controller 420, and scan flip flops (SFF) 433 and 435. Phase locked loop 410, which is part of the integrated circuit, generates PLL clock signal PLL_CLK for scan controller 420. Scan flip flops 433 and 435 are part of the scan chain of the clock domain. Furthermore, they are configured to hold control bits from the test equipment. Specifically, when the portions of the test vector for a scan chain is completely clocked into the scan chain, scan flip flop 435 is configured with a capture control bit indicating whether the clock domain is a capture clock domain or a non capture clock domain. Thus, scan flip flop 435 can be referred to as the capture control flip flop. However, because launch-on-shift scanning is being used, scan controller 420 must determine the state of the clock domain prior to the portion of the test vector being completely clocked into the scan chain. Thus, scan controller 420 reads the capture control bit as a capture/not non-capture signal C/!NC from scan flip flop 433, which precedes the capture control flip flop (i.e. scan flip flop 435) in the scan chain. As used herein, when capture/not non capture signal C/!NC is at logic high, the clock domain is a capture clock domain and when capture/not non capture signal is at logic low, the clock domain is a not-capture clock domain.

To ensure that the control bits reach the appropriate scan flip flops in each scan chain at the appropriate time, many embodiments of the present invention include dummy fill data in the portions of the test vectors for shorter scan chains. In a particular embodiment of the present invention, all scan chains are clocked for the duration of the longest scan chain when loading the portions of the test vectors into each scan chain (i.e. during SCAN PARTIAL TEST VECTOR INTO SCAN CHAINS 320). However, the portions of the test vector for shorter scan chains include dummy fill data at the at the beginning of the portions. For example if the longest scan chain includes 700 scan elements and a second scan chain includes 600 scan elements, the portion of the test vector for the second scan chain includes 100 bits of dummy fill data.

Scan controller 420 also receives scan clock signal S_CLK, which is generally provided by the external test equipment, and an external scan enable signal E_SCAN_E from the external test equipment. In general, scan clock signal S_CLK and PLL clock signal PLL_CLK are asynchronous. External scan enable signal E_SCAN_E, indicates whether the test equipment is scanning test vector data into the scan chains of the integrated circuit (when external scan enable signal E_SCAN_E is logic high) or the test equipment is allowing the integrated circuit to process the test vector (when external scan enable signal E_SCAN_E is logic low). Scan controller 420 generates circuit clock signal C_CLK, which is applied to the clock terminals of the scan chain and an internal scan enable signal I_SCAN_E to control whether data is scanned into the scan chain or the circuits in the scan chain perform the normal logic functions. In some embodiments of the present invention, internal scan enable signal I_SCAN_E is partially synchronized with circuit clock signal C_CLK. Specifically, the transition from active state to inactive state is synchronized with circuit clock signal C_CLK while the transition from inactive state to active state is asynchronous. More particularly, (as shown in FIG. 5 and described in more detail below) internal scan enable signal I_SCAN_E is a partially synchronized version of external scan enable signal E_SCAN_E.

Generally, scan controller 420 implements the flow chart of FIG. 3. More specifically, an embodiment of scan controller 420 in accordance with the present has implements the timing diagram of FIG. 5 (described below). In most embodiments of the present invention, scan clock signal S_CLK for each clock domain are identical (i.e. synchronized) so that the different clocking circuits have a common reference signal to order the clock signals as shown in FIG. 5 and described below. In other embodiments of the present invention, handshaking signals are used between the clock domains for synchronization.

Figure 5:
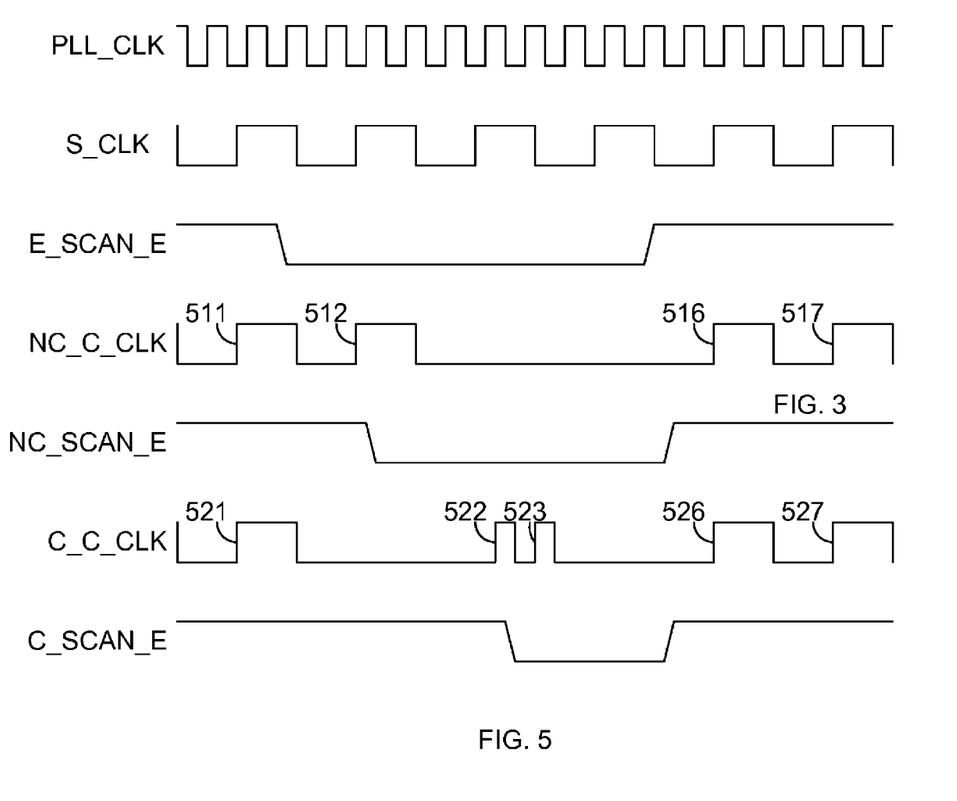
FIG. 5 is a timing diagram for one embodiment of the present invention.

FIG. 5 is a timing diagram for In accordance with an embodiment of the present invention. Specifically, FIG. 5 illustrates PLL clock signal PLL_CLK, scan clock signal S_CLK, external scan enable signal SCAN_E, non-capture circuit clock signal NC_C_CLK, non-capture scan enable signal NC_SCAN_E, capture circuit clock signal C_C_CLK, and capture scan enable signal C_SCAN_E. For illustrative purposes PLL clock signal PLL_CLK is only shown to have roughly three times the frequency of a scan clock signal S_CLK, however on actual test equipment and integrated circuit PLL clock signal PLL_CLK may have a frequency that is several orders of magnitude greater than the frequency of scan clock signal S_CLK. Non-capture circuit clock signal NC_C_CLK shows the clock signal that is applied to the scan chain of a non-capture clock domain. Non-capture scan enable signal NC_SCAN_E shows the scan enable signal for a non-capture clock domain. Conversely, Capture circuit clock signal C_C_CLK shows the clock signal that is applied to the scan chain of a capture clock domain and capture scan enable signal C_SCAN_E shows the can enable signal for a capture clock domain. With respect to FIG. 4, for non-capture clock domains, circuit clock signal C_CLK and internal scan enable signal I_SCAN_E are equivalent to non-capture circuit clock signal NC_C_CLK and non-capture scan enable signal NC_SCAN_E, respectively. For capture clock domains, circuit clock signal C_CLK and internal scan enable signal I_SCAN_E are equivalent to capture circuit clock signal C_C_CLK and capture scan enable signal, C_SCAN_E, respectively.

At the beginning of a test run, external scan enable signal E_SCAN_E is at logic high and the test equipment begins to scan test data into the scan chains. While, External scan enable signal E_SCAN_E is in the active state (i.e. logic high), non-capture scan enable signal NC_SCAN_E and capture scan enable signal E_SCAN_E are pulled to the active state (i.e. logic high). Furthermore, both non-capture circuit clock signal NC_C_CLK and capture circuit clock signal C_C_CLK are based on scan clock signal S_CLK. Thus data is clocked into the scan chains of both capture clock domains and non-capture clock domains. However, because, the test equipment is configured to perform launch-on-shift scanning, external scan enable signal E_SCAN_E transitions to the inactive state before the last bit of the portions of the test vectors is scanned into the scan chains. Thus, after active clock edge 511 of non-capture circuit clock signal NC_C_CLK one more bit of test data remains to be clocked into the scan chain for the non-capture clock domain. Similarly, after active clock edge 521 of capture clock signal C_C_CLK, one more bit of test data remains to be clocked into the scan chain for the capture clock domain.

Because additional data remains to be scanned into the scan chain, both Non-capture scan enable signal NC_S-CAN_E and capture scan enable signal C_SCAN_E remain at the active state (i.e. logic high). As explained above, whether a particular clock domain is a capture clock domain or a non-capture clock domain can be indicated using a capture control bit which is destined to be stored in a capture control flip flop within the scan chain. At this point, the scan controller for each domain reads the capture control bit from a scan flip flop that precedes the capture control flip flop to determine whether the clock domain is a capture clock domain or a non-capture clock domain. The scan controllers for non-capture clock domains then generate an active clock edge 512 on non-capture circuit clock signal NC_C_CLK to clock in the last bit of data into the scan chain of the non-capture clock domain. After clocking in the last bit of data, the scan controller pulls non-capture scan enable signal NC_S-CAN_E to the inactive state so that the circuits of the scan chain can perform their normal logic functions. In most embodiments of the present invention, non-capture clock domains are configured to provide inputs to the capture clock domain and thus are not clocked during the capture cycle of the capture clock domain. Thus, as shown in FIG. 5, non-capture circuit clock signal NC_C_CLK does not have active edges after active clock edge 512 until after the capture cycle (described below) of the capture clock domain. However, other embodiments of the present invention may clock the non-capture clock domains during the capture cycle of the capture clock domain. In some embodiments of the present invention, the scan controller reads the capture control flip flop to determine whether a capture clock cycle is to be initiated. However, in other embodiments the scan controller "remembers" whether the clock domain is a capture clock domain or a non-capture clock domain based on the previous reading of the capture control bit.

As explained above, the scan controller reads a capture control bit to determine whether the particular clock domain is a capture clock domain or a non-capture clock domain. The scan controllers of capture clock domain wait until after the time required to trigger active clock edge 512 and a few dummy cycles of PLL clock signal PLL_CLK to generate a pair of active edges based on PLL clock signal PLL_CLK. Specifically, the scan controller of the capture clock domain initiates a last shift launch cycle with active edge 522 of capture circuit clock signal C_C_CLK and then initiates a capture cycle with active clock edge 523 of capture circuit clock signal C_C_CLK. Thus, after active clock edge 522, the last bit of data is scanned into the scan chain of the capture clock domain. Accordingly, capture scan enable signal C_SCAN_E is pulled to the inactive state following active clock edge 522. Therefore at active clock edge 523, the circuits of the scan chain of the capture clock domain can perform their normal logic functions to generate test results for analysis.

To read out the test results, external can enable E_SCAN_E is pulled to the active state, which causes non-capture scan enable NC_SCAN_E and capture scan enable C_SCAN_E to be pulled to the active state. Thus, active clock edges 516 and 517 of non capture circuit clock signal NC_C_CLK cause the scan chain to clock test result data out and new test data into the scan chain of the non-capture clock domain. Similarly, active clock edges 526 and 526 of capture circuit clock signal C_C_CLK cause the scan chain to clock test result data out and new test data into the scan chain of the capture clock domain.

Numerous modifications and adaptations of the embodiments described herein will become apparent to the skilled artisan in view of this disclosure and are encompassed by the scope of the invention.

What is claimed is:

1. A method of testing an integrated circuit having a first capture clock domain with a first capture clock domain scan-chain and a first non-capture clock domain with a first non-capture clock domain scan chain; the method comprising:

shifting a beginning subset of a first portion of a test vector into the first capture clock domain scan chain;

shifting a beginning subset of a second portion of a test vector into the first non-capture clock domain scan chain;

shifting an ending subset of the second portion of the test vector into the first non-capture clock domain scan chain, wherein the union of the beginning subset of the second portion of the test vector and the ending subset of the second portion of the test vector is equal to the second portion of the test vector;

shifting an ending subset of the first portion of the test vector into the first capture clock domain scan chain, wherein the union of the beginning subset of the first portion of the test vector and the ending subset of the first portion of the test vector is equal to the first portion of the test vector, wherein the shifting an ending subset of the first portion of the test vector into the first capture clock domain scan chain occurs after the shifting an ending subset of the second portion of the test vector into the first non-capture clock domain scan chain; and clocking the first capture clock domain to generate test results in the first capture clock domain scan chain.

2. The method of claim 1, wherein the shifting a beginning subset of a first portion of a test vector into the first capture clock domain scan chain and the shifting a beginning subset of a second portion of a test vector into the first non-capture clock domain scan chain occurs simultaneously.

3. The method of claim 1, wherein:

the shifting a beginning subset of a first portion of a test vector into the first capture clock domain scan chain; the shifting a beginning subset of a second portion of a test vector into the first non-capture clock domain scan chain; and the shifting an ending subset of the second portion of the test vector into the first non-capture clock domain scan chain occurs at a first clock frequency; and shifting an ending subset of the first portion of the test vector into the first capture clock domain scan chain and the clocking the first capture clock domain to generate test results in the first capture clock domain scan chain occurs at a second clock frequency.

4. The method of claim 3, wherein the first frequency is a scanning frequency and the second frequency is an operating frequency greater than the scanning frequency.

5. The method of claim 1, wherein the first portion of the test vector consists of N bits, the beginning subset of the first portion of the test vector consists of N−1 bits and the ending subset of the first portion of the test vector consists of 1 bit.

6. The method of claim 5, wherein the ending subset of the second portion of the test vector consists of 1 bit.

7. The method of claim 1, wherein:

the shifting a beginning subset of a first portion of a test vector into the first capture clock domain scan chain; the shifting a beginning subset of a second portion of a test vector into the first non-capture clock domain scan chain; and the shifting an ending subset of the second portion of the test vector into the first non-capture clock domain scan chain is based on a first clock signal; and shifting an ending subset of the first portion of the test vector into the first capture clock domain scan chain and the clocking the first capture clock domain to generate test results in the first capture clock domain scan chain is based on a second clock signal.

8. The method of claim 7, wherein the first clock signal and second clock signal are asynchronous.

9. The method of claim 7, wherein the first clock signal is an external clock signal and the second clock signal is an internal clock signal.

10. The method of claim 1, wherein the capture clock domain scan chain includes a capture control flip-flop and wherein the beginning subset of the first version of the test vector includes a capture control bit to be stored in the capture control flip-flop after the shifting an ending subset of the first portion of the test vector into the first capture clock domain scan chain.

11. The method of claim 10, further comprising reading the capture control bit before the capture control bit is stored in the capture control flip flop.

12. The method of claim 1, further comprising:

shifting a beginning subset of a third portion of a test vector into a second non-capture clock domain scan chain; and shifting an ending subset of the third portion of the test vector into the second non-capture clock domain scan chain, wherein the union of the beginning subset of the third portion of the test vector and the ending subset of the third portion of the test vector is equal to the third portion of the test vector.

13. The method of claim 1, further comprising:

shifting a beginning subset of a third portion of a test vector into a second capture clock domain scan chain;

shifting an ending subset of the third portion of the test vector into the second capture clock domain scan chain, wherein the union of the beginning subset of the third portion of the test vector and the ending subset of the third portion of the test vector is equal to the third portion of the test vector; and clocking the second capture clock domain to generate test results in the second capture clock domain scan chain.

14. A method of testing an integrated circuit having a first capture clock domain with a first capture clock domain scan-chain and a first non-capture clock domain with a first non-capture clock domain scan chain; the method comprising:

shifting all but one bit of a first portion of a test vector in the first capture clock domain scan-chain;

shifting all but one bit of a second portion of the test vector in the first non-capture clock domain scan chain;

shifting a last bit of the second portion of the test vector into the first non-capture clock domain scan chain;

performing a last shift launch cycle in the first capture clock domain after the shifting a last bit of the second portion of the test vector into the first non-capture clock domain scan chain; and performing a capture cycle in the first capture clock domain.

15. The method of claim 14, wherein the shifting all but one bit of a second portion of the test vector in the first non-capture clock domain scan chain and the shifting a last bit of the second portion of the test vector into the first non-capture clock domain scan chain occur simultaneously.

16. The method of claim 14, wherein:

shifting all but one bit of a first portion of a test vector in the first capture clock domain scan-chain, shifting all but one bit of a second portion of the test vector in the first non-capture clock domain scan chain, and shifting a last bit of the second portion of the test vector into the first non-capture clock domain scan chain is based on a first clock signal; and the last shift launch cycle and the capture cycle are based on a second clock signal.

17. The method of claim 16, wherein the first clock signal is an external clock signal and the second clock signal is an internal clock signal.

18. An integrated circuit comprising:
a first capture clock domain with a first capture clock domain scan-chain;
a first non-capture clock domain with a first non-capture clock domain scan chain;
means for shifting a beginning subset of a first portion of a test vector into the first capture clock domain scan chain;
means for shifting a beginning subset of a second portion of a test vector into the first non-capture clock domain scan chain;
means for shifting an ending subset of the second portion of the test vector into the first non-capture clock domain scan chain, wherein the union of the beginning subset of the second portion of the test vector and the ending subset of the second portion of the test vector is equal to the second portion of the test vector;
means for shifting an ending subset of the first portion of the test vector into the first capture clock domain scan chain, wherein the union of the beginning subset of the first portion of the test vector and the ending subset of the first portion of the test vector is equal to the first portion of the test vector, wherein the shifting an ending subset of the first portion of the test vector into the first capture clock domain scan chain occurs after the shifting an ending subset of the second portion of the test vector into the first non-capture clock domain scan chain; and
means for clocking the first capture clock domain to generate test results in the first capture clock domain scan chain.

19. The integrated circuit of claim 18, wherein the first portion of the test vector consists of N bits, the beginning subset of the first portion of the test vector consists of N−1 bits and the ending subset of the first portion of the test vector consists of 1 bit.

20. The integrated circuit of claim 19, wherein the ending subset of the second portion of the test vector consists of 1 bit.

21. The integrated circuit of claim 18, further comprising:
means to receive an external clock signal; and
a phase locked loop to generate an internal clock signal.

22. The integrated circuit of claim 21, wherein:
the means for shifting a beginning subset of a first portion of a test vector into the first capture clock domain scan chain is configured to use the external clock signal;
the means for shifting a beginning subset of a second portion of a test vector into the first non-capture clock domain scan chain is configured to use the external clock signal;
the means for shifting an ending subset of the second portion of the test vector into the first non-capture clock domain scan chain is configured to use the external clock signal;
the means for shifting an ending subset of the first portion of the test vector into the first capture clock domain scan chain, is configured to use the internal clock signal; and
the means for clocking the first capture clock domain to generate test results in the first capture clock domain scan chain is configured to use the internal clock signal.

* * * * *